United States Patent
Hutchison et al.

(10) Patent No.: US 9,985,197 B2
(45) Date of Patent: May 29, 2018

(54) FLEXIBLE MOLECULAR PIEZOELECTRIC DEVICE

(71) Applicant: University of Pittsburgh—Of The Commonwealth System of Higher Education, Pittsburgh, PA (US)

(72) Inventors: Geoffrey R. Hutchison, Pittsburgh, PA (US); Xinfeng Quan, Pittsburgh, PA (US)

(73) Assignee: University of Pittsburgh—Of The Commonwealth System of Higher Education, Pittsburgh, PA (US)

( * ) Notice: Subject to any disclaimer, the term of this patent is extended or adjusted under 35 U.S.C. 154(b) by 1015 days.

(21) Appl. No.: 14/099,783

(22) Filed: Dec. 6, 2013

(65) Prior Publication Data

US 2014/0375172 A1    Dec. 25, 2014

Related U.S. Application Data

(60) Provisional application No. 61/734,654, filed on Dec. 7, 2012.

(51) Int. Cl.
| | | |
|---|---|---|
| *H01L 41/193* | (2006.01) | |
| *H01L 41/113* | (2006.01) | |
| *H01L 41/08* | (2006.01) | |
| *H01L 41/317* | (2013.01) | |

(52) U.S. Cl.
CPC ........ *H01L 41/193* (2013.01); *H01L 41/0805* (2013.01); *H01L 41/1132* (2013.01); *H01L 41/317* (2013.01)

(58) Field of Classification Search
CPC ........... C07K 7/06; C07K 17/14; H01L 41/16; H01L 41/18; H01L 41/193; H01L 41/0805; H01L 41/081; H01L 41/0815
See application file for complete search history.

(56) References Cited

U.S. PATENT DOCUMENTS

| | | | | |
|---|---|---|---|---|
| 4,896,174 A | * | 1/1990 | Stearns | G03G 15/323 347/120 |
| 6,539,774 B1 | * | 4/2003 | Zinck | G01B 7/16 436/144 |
| 7,538,188 B2 | * | 5/2009 | Lin | C07K 7/06 435/287.9 |
| 9,362,481 B2 | * | 6/2016 | Yu | H01L 41/1132 |
| 2003/0179381 A1 | * | 9/2003 | Kinoshita | G01N 21/78 356/450 |
| 2011/0008212 A1 | * | 1/2011 | Ichimura | C07K 14/705 422/69 |

FOREIGN PATENT DOCUMENTS

JP    62-270619 A  * 11/1987

OTHER PUBLICATIONS

Morita et al. Photocurrent Generation under a Large Dipole Moment Formed by Self-Assembled Monolayers of Helical Peptides . . . Journal of the American Chemical Society. 2000, vol. 122, pp. 2850-2859.*

* cited by examiner

*Primary Examiner* — Jeffrey E. Russel
(74) *Attorney, Agent, or Firm* — Paul D. Bangor, Jr.; Clark Hill PLC

(57) ABSTRACT

A piezoelectric material, comprising: a piezoelectric self-assembling monolayer of oligopeptides; a conductive surface; and a substrate, wherein the conductive surface is located between the piezoelectric self-assembling monolayer of oligopeptides and the substrate. A touch sensitive device, comprising: a first piezoelectric material, comprising: a piezoelectric self-assembling monolayer of oligopeptides containing a dipole moment; a conductive surface; and a substrate; a second piezoelectric material, comprising: a piezoelectric self-assembling monolayer of oligopeptides containing a dipole moment; a conductive surface; and a substrate, wherein the oligopeptides making up the self-assembling monolayer of the first and second piezoelectric materials, respectively, have the same amino acid sequence but have an equal and opposite dipole moment.

16 Claims, 10 Drawing Sheets

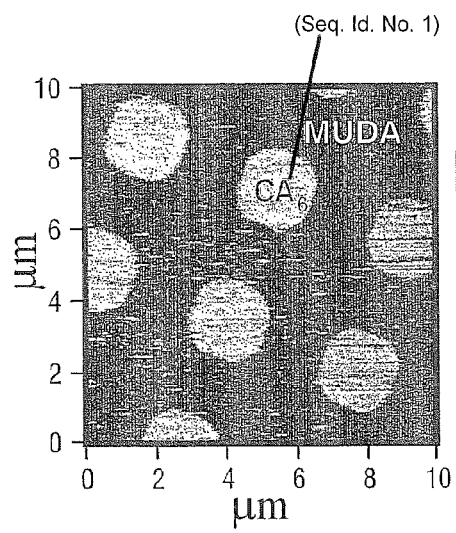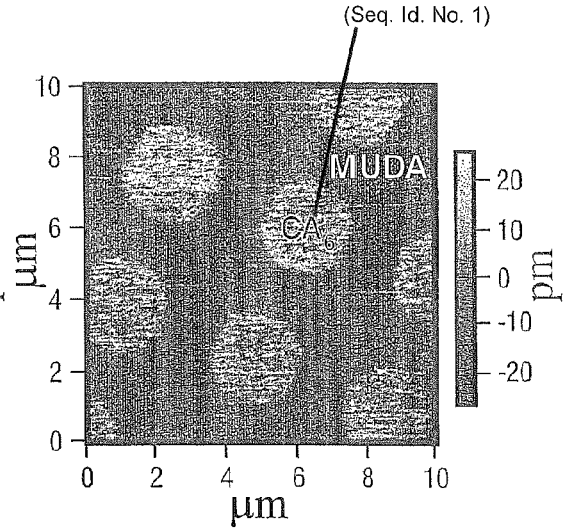
Fig.6A　　　　　　　　　　Fig.6B
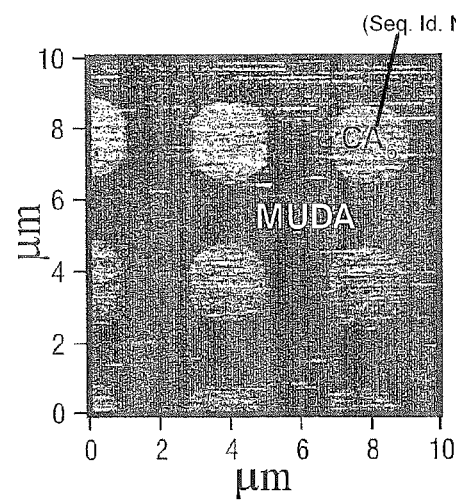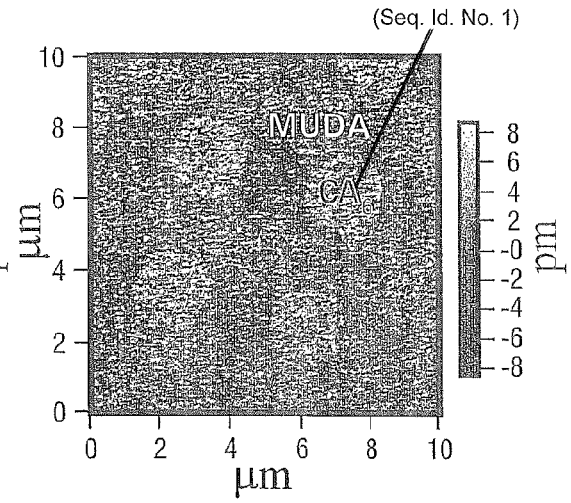
Fig.6C　　　　　　　　　　Fig.6D 0 V/nm field:

1 V/nm field:

4.3 V/nm field:

FLEXIBLE MOLECULAR PIEZOELECTRIC DEVICE

RELATED APPLICATIONS

This application claims priority benefit under 35 U.S.C. § 119(e) of U.S. Provisional Application No. 61/734,654, filed Dec. 7, 2012 the contents of which are herein incorporated by reference.

GOVERNMENTAL RIGHTS

This invention was made with government support under Grant No. FA9550-12-1-0228 awarded by the Air Force Office of Scientific Research (AFOSR). The government has certain rights in the invention.

FIELD OF THE INVENTION

The present disclosure describes flexible, inherently piezoelectric self-assembled monolayers of oligopeptides and the use of these monolayers in touch-sensitive devices.

BACKGROUND

Molecular and organic electronic materials have shown tremendous promise for lightweight, flexible devices, with broad applications from efficient lighting and displays, to sensors, solar electric generation, and even ferroelectrics. Despite such success, integrated efficient energy storage, conversion and generation mechanisms are critical. To address this need, a combined experimental and computational investigation of molecular piezoelectric response that demonstrates applied electric fields can drive significant conformational changes, even in single self-assembled monolayers is needed.

Recent investigations in nanostructured ZnO and related piezoelectric semiconductors have shown promise to interconvert mechanical and electrical energy for piezoelectric fabrics, nanogenerators powered by sound waves, and self-powered displays and sensors. For organic and biological materials, bulk piezoelectric response has been measured in polymers like polyvinylidene difluoride (PVDF), polar organic crystals, and even skin, only recently has nanoscale characterization been possible. Modern atomic force microscopy (AFM) and piezoresponse force microscopy (PFM) now enables the determination of the limits of piezoelectric distortion, including the piezoresponse of biological materials, such as individual collagen fibrils, blood cells, peptide nanotubes, and viral capsids.

SUMMARY

A first aspect of the present disclosure includes a piezoelectric material, comprising: a piezoelectric self-assembling monolayer of oligopeptides, which preferably may be flexible; a conductive surface; and a substrate, wherein the conductive surface is located between the oligopeptide and the substrate. In a preferred embodiment the conductive surface is formed by vapor deposition of a conductive material onto the substrate. In a preferred embodiment the conductive material is a metal. In a preferred embodiment the metal is selected from the group consisting of: gold; silver; copper; aluminum, zinc and mercury. In a preferred embodiment the metal is gold. In a preferred embodiment the substrate is selected from the group consisting of: insulator and dielectric. In a preferred embodiment the substrate is a dielectric. In a preferred embodiment the dielectric is polydimethylsiloxane. In a preferred embodiment the oligopeptide material contains between two and twenty amino acids. In a preferred embodiment the amino acids are naturally occurring. In a preferred embodiment the amino acids are selected from the group consisting of: alanine, arginine, cysteine, glutamic acid, glutamine, isoleucine, leucine, lysine, methionine, serine and tryptophan. In a preferred embodiment the oligopeptide has the amino acid sequence CAAAAAA (Seq. Id. No.: 1). In a preferred embodiment the gold layer is between about 50 nm and about 400 nm thick. In a preferred embodiment the gold layer is about 200 nm thick. In a preferred embodiment the piezoelectric response as determined by piezo-force microscopy is between about 0.1 pm/V and about 2.0 pm/V. In a preferred embodiment the piezoelectric response is between about 0.3 pm/v and about 0.7 pm/V.

A second aspect of the present disclosure is a touch sensitive device, comprising: a first piezoelectric material, comprising: a piezoelectric self-assembling monolayer of oligopeptides containing a dipole moment; a conductive surface; and a substrate; a second piezoelectric material, comprising: a piezoelectric self-assembling monolayer of oligopeptides containing a dipole moment; a conductive surface; and a substrate, wherein the oligopeptides making up the self-assembling monolayer of the first and second piezoelectric materials, respectively, have the same amino acid sequence but have an equal and opposite dipole moment. In a preferred embodiment the oligopeptides making up the self-assembling monolayers have the amino acid sequence CAAAAAA (Seq. Id. No.: 1). In a preferred embodiment the conductive surface is gold. In a preferred embodiment the substrate is polydimethylsiloxane.

BRIEF DESCRIPTION OF THE DRAWINGS

FIG. 1A Real-time PFM amplitude of $CA_6$ (Seq. Id. No.: 1) monolayer as a function of applied bias voltage, FIG. 1B AFM topography of oligopeptide $CA_6$ (Seq. Id. No.: 1) (left) and dodecanethiol (DT, right) patterned monolayers, and FIG. 1C DART-PFM amplitude at an applied bias of 3V for patterned $CA_6$ (Seq. Id. No.: 1) and DT monolayers, showing contrast with bare gold.

FIG. 2A AFM topography of oligopeptide $CA_6$ (Seq. Id. No.: 1) SAM on bare gold, FIG. 2B AFM topography of the same film after depositing a solution of 11-mercaptoundecanoic acid (MUA) to fill all exposed gold regions, FIG. 2C AFM phase data of mixed $CA_6$ (Seq. Id. No.: 1)/MUA film, indicating slight differences in phase between $CA_6$ (Seq. Id. No.: 1) "dots" and MUA background, and FIG. 2D single-frequency PFM amplitude of a mixed $CA_6$ (Seq. Id. No.: 1)/MUA film with an applied bias of 3V.

FIG. 3A DART-PFM amplitude of $CA_6$ (Seq. Id. No.: 1) SAMs on bare gold, showing clearly increasing amplitude with increasing bias, FIG. 3B example histograms of DART-PFM amplitudes as a function of increasing bias voltage, and FIG. 3C linear correlation between FWHM of histograms (as a measure of "average" response) and applied drive bias voltage.

FIG. 4A schematic of a flexible bilayer piezosensor device, indicating use of the reverse sequence ($A_6C$) (Seq. Id. No. 2) to ensure overall polar order when the bilayer is assembled, FIG. 4B current vs. time and force vs. time curves for mechanical testing of the $CA_6$ (Seq. Id. No.: 1): $A_6C$ (Seq. Id. No. 2) bilayer device, showing ~0.5 nA peak current, and FIG. 4C current vs. time for the MUDA monolayer device, showing <0.1 nA peak current.

FIGS. 6A-6D show single-frequency PFM characterization of mixed $CA_6$ (Seq. Id. No.: 1)/MUA monolayers over time, from as-prepared "0-day," (FIG. 6A) 8 days later (FIG. 6B), 21 days later (FIG. 6C), and 42 days later (FIG. 6D).

FIG. 7A AFM topography of oligopeptide $CA_6$ (Seq. Id. No.: 1), FIG. 7B AFM topography of dodecanethiol (DT), FIG. 7C DART-PFM amplitude of $CA_6$ (Seq. Id. No.: 1) with an applied bias of 3V, and FIG. 7D DART-PFM amplitude of DT with an applied bias of 3V.

FIG. 8A, with no applied field, illustrates predominantly random coil conformations. FIG. 8B, with 1 V/nm applied field, illustrates the presence of helical domains and alignment with the z-axis of applied field. FIG. 8C, with 4.3 V/nm applied field, highlights fully extended conformations.

(FIG. 9A) dodecanethiol (DT) and 11-mercaptoundecanoic acid (MUA), using the molecular height along the z-axis, (FIG. 9B) α-helical $CA_6$ (Seq. Id. No.: 1) using the terminal C and N atoms, and showing linear response near zero field, and transition to a $3_{10}$ helix at ~1.1 V/nm, (FIG. 9C) linear $CA_6$ (Seq. Id. No.: 1) using the terminal C and N atoms, showing little piezoresponse, and (FIG. 9D) three $CA_6$ (Seq. Id. No.: 1) random coil conformations from the MD trajectories, illustrating nonlinear response as the oligomer kinks and unkinks.

DETAILED DESCRIPTION

It is to be understood that the descriptions of the present disclosure have been simplified to illustrate elements that are relevant for a clear understanding of the present disclosure, while eliminating, for purposes of clarity, other elements that may be well known. Those of ordinary skill in the art will recognize that other elements are desirable and/or required in order to implement the present disclosure. However, because such elements are well known in the art, and because they do not facilitate a better understanding of the present disclosure, a discussion of such elements is not provided herein. Additionally, it is to be understood that the present disclosure is not limited to the embodiments described above, but encompasses any and all embodiments within the scope of the description and the following claims.

Definitions

The following definitions apply to the terms as used throughout this specification, unless otherwise limited in specific instances.

As used herein, the term "piezoelectric" is defined as solid materials (notably crystals, certain ceramics and biological matter such as bone, DNA and various proteins) that develop and accumulate an electrical charge in response to applied mechanical stress.

As used herein the term "oligopeptide" is defined as a peptide consisting of a small number of amino acids usually, between 2 and 20.

As used herein the term "PDMS" is defined as poly-dimethylsiloxane.

DESCRIPTION

Dramatic recent advancements in molecular-scale electronic devices have rarely included energy conversion or generation, although such techniques are crucial for eventual applications. The present disclosure demonstrates that an applied electric field causes piezoelectric distortion of the preferred molecular conformation across single molecular monolayers of oligopeptides. According to the present disclosure, self-assembled monolayers ~1.3 nm high have been deposited onto smooth gold surfaces. Such monolayers exhibit strong piezoelectric response that varies linearly with applied bias (1-4V), measured using piezo-force microscopy (PFM). The response is markedly greater than control experiments with rigid alkanethiols, and correlates with combined theoretical predictions of conformational change driven by applied electric fields. To test energy conversion ability, simple, flexible piezoelectric devices were fabricated which generate X nA of electrical current in response to finger presses. Unlike existing piezoelectric oxides, peptide monolayers according to the present disclosure are intrinsically flexible, easily fabricated, aligned, and patterned without poling, and possess strong piezoresponse on the nanoscale.

Figure 1A:
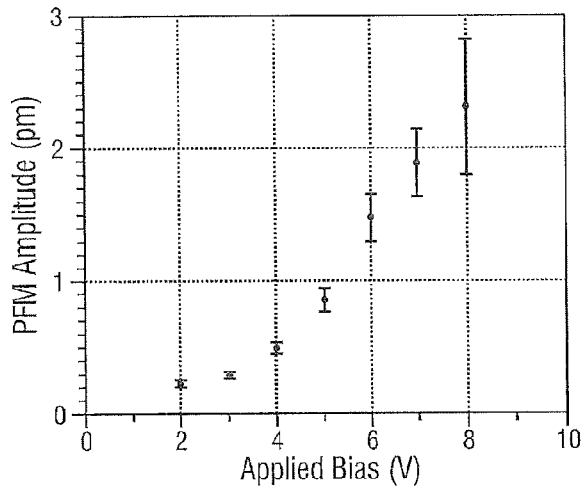
FIGS. 1A-1C show atomic force topography and piezo-force amplitude of patterned molecular monolayers.

Single monolayer piezoelectrics with intrinsic polar ordering are described in the present application. A solution of short oligopeptides (with sequence CAAAAAA (Seq. Id. No.: 1), or $CA_6$ (Seq. Id. No.: 1)) was deposited onto smooth template-stripped gold substrates using self-assembly through the cysteine-gold interaction. The piezoelectric response was determined by the real-time PFM technique, where the tip is placed in contact with the oligopeptide surface, a bias voltage is applied, and the resulting increase in height amplitude is determined as a function of applied voltage. To ensure reliable accuracy, five different sections of the film were measured (FIG. 1A) to see the same response with multiple films and multiple tips. The results suggest that the piezoresponse of the oligopeptide monolayer is ~0.5 pm/V. Using the same technique on a periodically poled lithium niobate (PPLN) standard sample, a piezoresponse of ~18.9 pm/V (FIG. 5), in excellent agreement with previous reports was measured.

There are many limitations, however, with obtaining a quantitative PFM measurement for weak and soft piezoelectric materials because of the existence of electrostatic effects between the tip and surface, (Kalinin, S V.; Bonnell, D. A., *Physical Review B*, 2002, 65, 125408) the potential drop from the tip to the surface due to weak indentation and high surface resistance, (id.) nonlocal effects, (Jungk, T.; Hoffmann, A.; Soergel, E., *Applied Physics Letters*, 2006, 89). and the problematic calibration from a standard piezoelectric material. (Jungk, T.; Hoffmann, A.; Soergel, E., *Appl. Phys. Lett.*, 2007, 91) An improved technique for measuring piezoelectric materials with low response and non-uniform surfaces, dual AC resonance tracking (DART) PFM, provides improved signal-to-noise and lower resonance artifacts. (Rodriguez, B. J.; et al., *Nanotechnology*, 2007, 18, 475504).

Figure 1B:
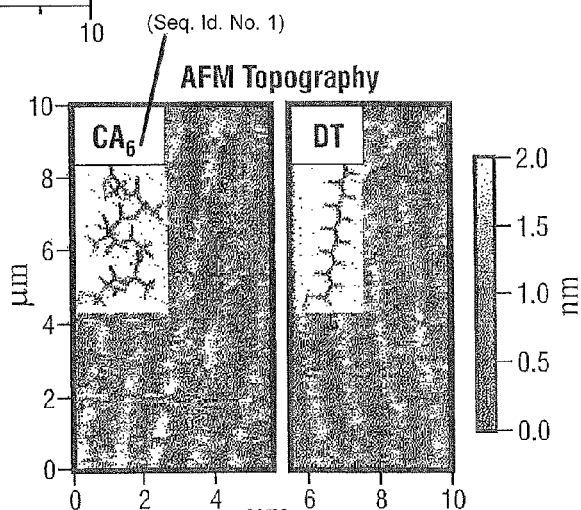
Figure 1C:
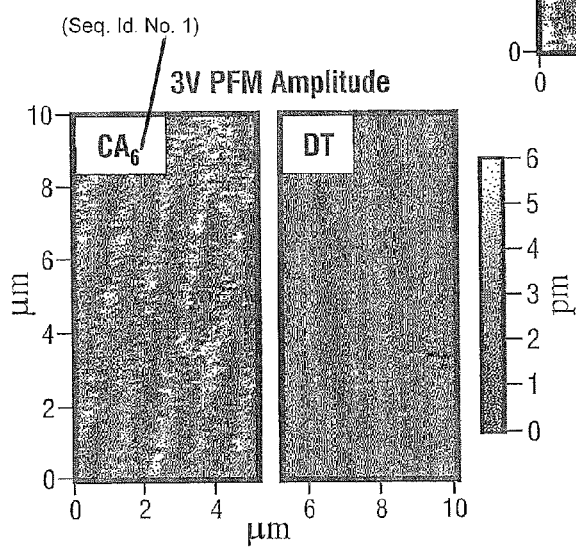

The contrast between the molecular monolayer and the bare gold surface was examined using a simple microcontact stamp to produce ~1 μm spacing between lines of deposited molecular monolayers. The patterning yields incomplete coverage of the peptides across the gold surface, and thus only a single monolayer forms via self-assembly. bAFM topography (FIG. 1B) indicates a film height (~1.5 nm) that corresponds closely to the computed molecular size (1.37 nm, vide infra). As a control, patterned single monolayers of dodecanethiol (DT) were deposited by the same method onto gold substrates (FIG. 1B), and again a monolayer forms, judging by the agreement between AFM topography (~1.6 nm) and computed molecular size (1.71 nm). To determine piezoelectric response of both films, a 3V AC electric field is applied using DART PFM. In the $CA_6$ (Seq. Id. No.: 1) film, electromechanical distortion yields increased amplitude (up to ~6 pm) in the molecular stripes, and no measurable response in the bare gold regions (FIG. 1C). Substantially less amplitude (~300 fm) however, is observed from the dodecanethiol monolayers. The relatively large PFM amplitude from the $CA_6$ (Seq. Id. No.: 1) monolayer derives primarily from intrinsic molecular conformational changes caused by the applied electric field, and not from electrostatic effects.

Figure 2A:
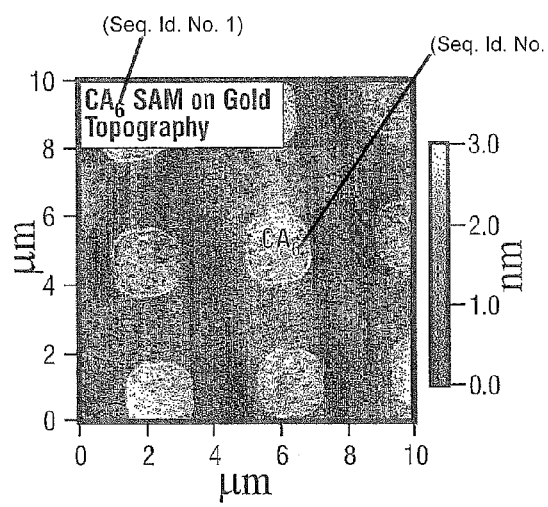
FIGS. 2A-2D show AFM topography, phase and piezo-force amplitude of patterned and mixed monolayers.
Figure 2B:
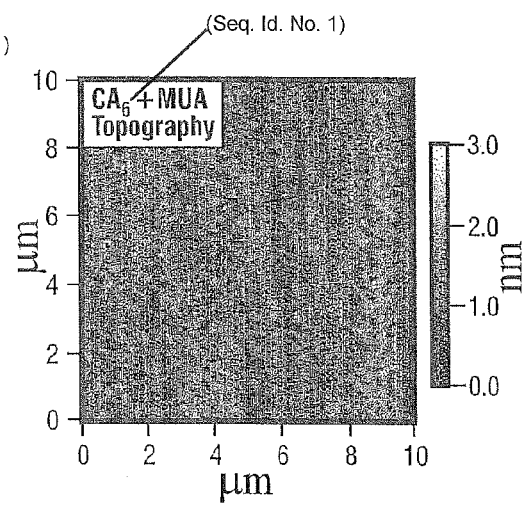
Figure 2C:
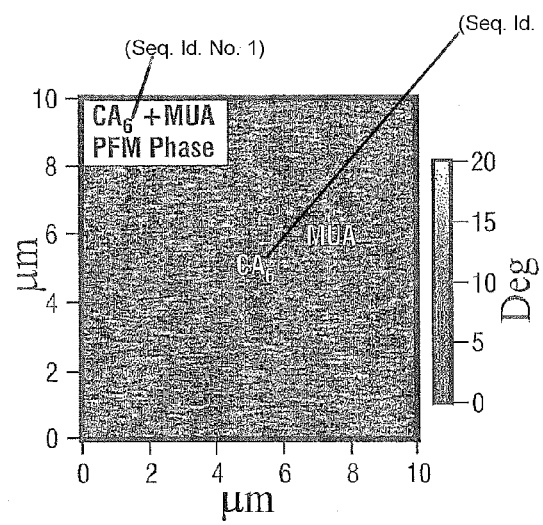
Figure 5A:
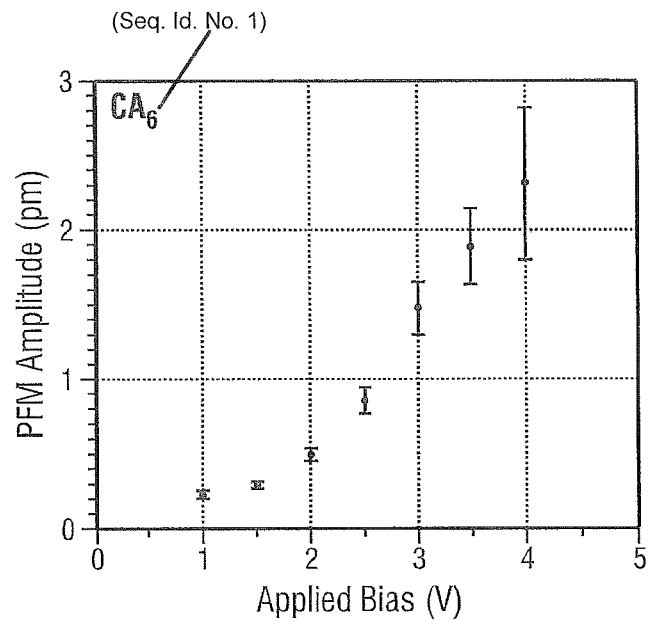
FIGS. 5A-5B show real-time PFM results for $CA_6$ (Seq. Id. No.: 1) (FIG. 5A) and PPLN (FIG. 5B).
Figure 5B:
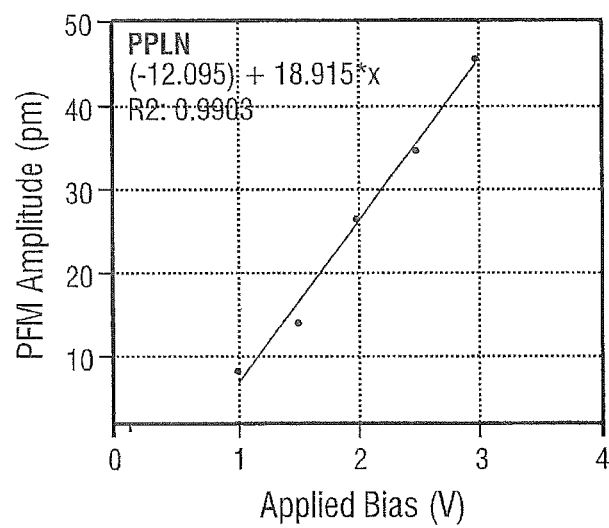
Figure 7A:
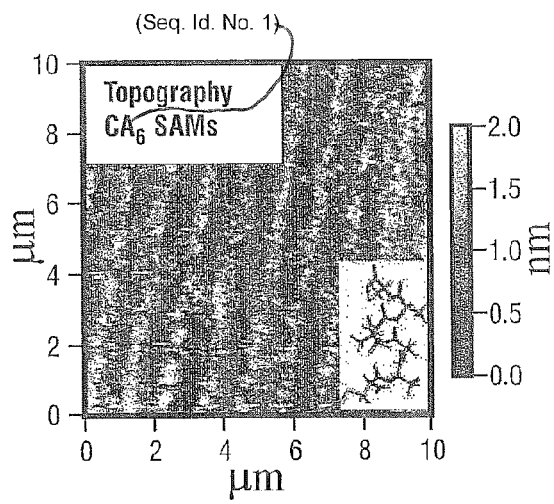
FIGS. 7A-7D show atomic-force topography and piezo-force amplitude of patterned molecular monolayers.
Figure 7B:
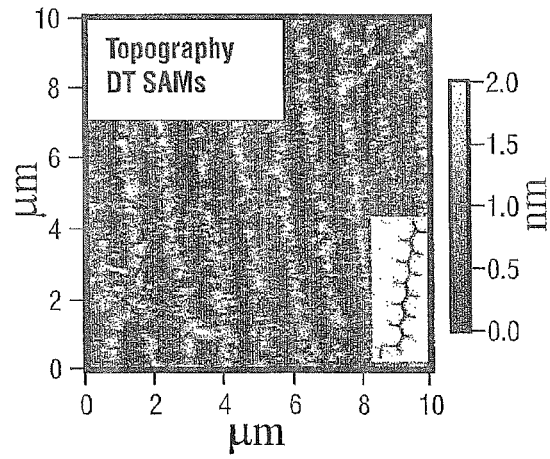
Figure 7C:
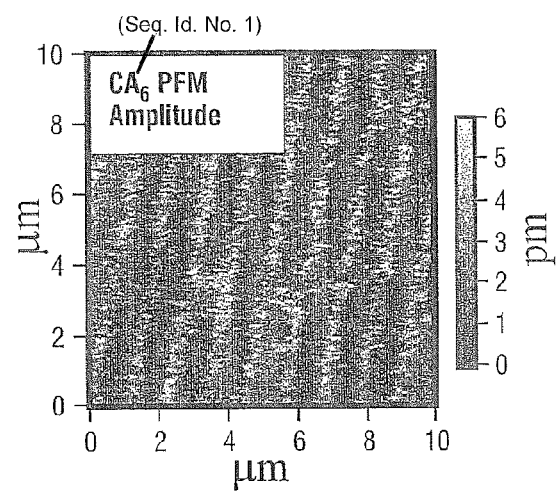
Figure 7D:
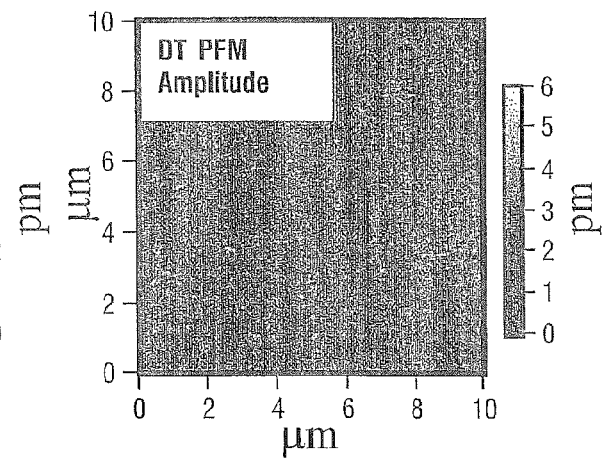

Since the PFM characterization has been performed in ambient conditions, a water meniscus will form at the surface-tip interface. At neutral pH, the C-terminus of $CA_6$ (Seq. Id. No.: 1) will yield an anionic carboxylate-terminated surface atop the oligopeptide monolayer (vide infra). Some of the observed PFM amplitude may thus derive from electrostatic effects. Such electrostatic response would not only be different between the bare gold surface and the carboxylate-terminated $CA_6$ (Seq. Id. No.: 1) monolayers, but may explain the larger response of $CA_6$ (Seq. Id. No.: 1) when compared to the nonpolar, alkyl-terminated DT monolayers. Films using $CA_6$ (Seq. Id. No.: 1) peptide monolayer "dot" patterns (FIG. 2A) were prepared, followed by back-filling the remaining exposed gold surface using 11-mercaptoundecanoic acid (MUA), since both molecules have anionic carboxylate groups at neutral pH (FIG. 2B). Both $CA_6$ (Seq. Id. No.: 1) and MUA have similar computed heights (1.37 nm and 1.88 nm, respectively), so the AFM topology of the mixed film (FIG. 2B) appears largely featureless, although the phase channel (FIG. 2C) shows slight variation between regions of the two molecular monolayers. While both $CA_6$ (Seq. Id. No.: 1) and MUA have comparable heights and terminal carboxylate groups, the computed piezo-driven conformational change in MUA (vide infra) is dramatically smaller than $CA_6$ (Seq. Id. No.: 1). As seen experimentally in FIG. 2D, the $CA_6$ (Seq. Id. No.: 1) islands exhibit markedly greater PFM amplitude at 3V bias, than MUA (~10 pm/V greater). These mixed $CA_6$ (Seq. Id. No.: 1)/MUA films are highly stable, and have demonstrated pattern retention and strong PFM response over 42 days in ambient conditions (FIG. 5). While the single-frequency PFM mode used to image the mixed $CA_6$ (Seq. Id. No.: 1)/MUA films cannot yield reliable quantitative measurements of the piezoresponse of the two materials, this technique clearly indicates that the PFM amplitude observed in $CA_6$ (Seq. Id. No.: 1) patterns derives from molecular conformational changes, not from electrostatic effects of the carboxylate end group.

Figure 3A:
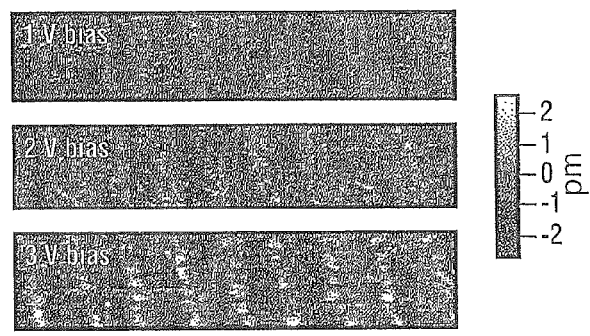
FIGS. 3A-3C show Piezo amplitude of $CA_6$ (Seq. Id. No.: 1) SAMs as a function of increasing applied bias voltage.
Figure 3B:
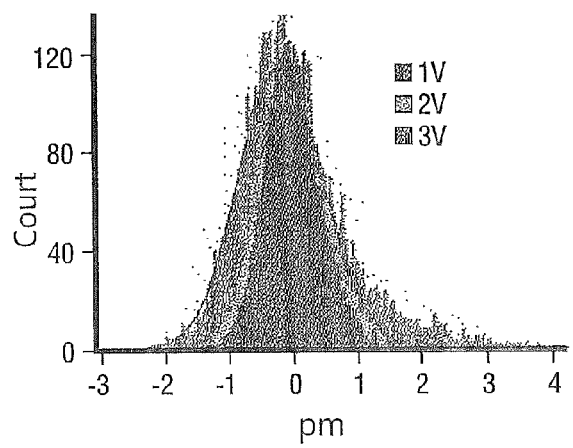
Figure 3C:
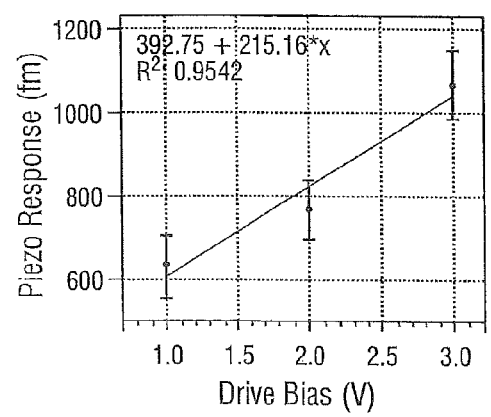

Multiple electromechanical distortions are possible, but a purely piezoelectric distortion should be linear in response to increasing applied bias. As the PFM drive bias is increased, the measured amplitude increases substantially (FIG. 3A). The PFM amplitude, however, is averaged across an ensemble of ~$10^4$ molecules, based on the effective tip radius, and convoluted with nonlocal and electrostatic response, not just the piezoelectric deformation of the monolayers. For example, the real-time PFM data (FIG. 1A) shows nonlinear voltage response at low voltages. Consequently, to quantitatively consider the response of the $CA_6$ (Seq. Id. No.: 1) monolayers to electric field, the PFM amplitudes were analyzed as histograms as a function of increasing electric field (FIG. 3B). The low-response (left) edge of the histograms serves as a baseline for the gold surface, and the high-response (right) edge of the histograms indicates the molecular extension. Both line scans and histograms indicate a great many molecules exhibit large response. For the sake of quantitative analysis, full width at half-maximum (FWHM) was used as a measure of the PFM amplitude. Again, to ensure reliable results, the average across multiple regions on multiple films and with multiple tips and the FWHM is clearly linear in response to applied electric field (FIG. 3C).

Figures 3D, 3E, 3F:
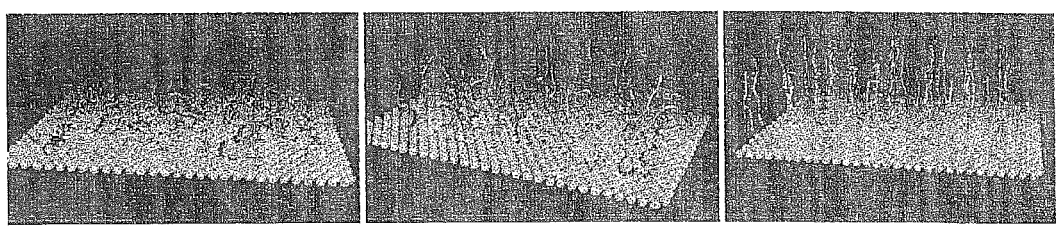
FIGS. 3D-3F Molecular dynamics snapshots of a simulated $CA_6$ (Seq. Id. No.: 1) monolayer as a function of increasing electric field at 0 V/nm (FIG. 3D), 1 V/nm (FIG. 3E), and 4.3 V/nm (FIG. 3F).

Since the $CA_6$ (Seq. Id. No.: 1) sequence is short, despite the presence of an oligo-alanine block, the preferred conformation in solution is likely to be a random coil. The predominant conformation, however, has been shown to change due to assembly on metal surfaces, particularly in the presence of electric field gradients. To address the preferred conformation of $CA_6$ (Seq. Id. No.: 1) in our system, molecular dynamics (MD) calculations were performed on an array of $CA_6$ (Seq. Id. No.: 1) molecules, simulating the self-assembled monolayers, both with and without an applied electric field. Using the predicted pKa and isoelectric points of $CA_6$ (Seq. Id. No.: 1), the carboxylate terminus of the sequence is anionic, but the amine terminus is neutral and unprotonated. Computed MD trajectories using zero applied electric field or fields smaller than 1 V/nm are predicted to exhibit no helical structure or significant molecular extension (FIG. 3D). Upon increasing the applied electric field to 1 V/nm the $CA_6$ (Seq. Id. No.: 1) molecules are predicted to extend in the applied field and adopt more helical or linear extended conformations (FIG. 3E). At an applied field of 4.3 V/nm, the MD trajectories predict the $CA_6$ (Seq. Id. No.: 1) molecules adopt almost exclusively a linear extended conformation (FIG. 3F).

While these MD simulations confirm the experimental observation of piezoelectric deformation in $CA_6$ (Seq. Id. No.: 1) monolayers, classical force fields used in MD cannot properly treat the polarizable electrostatic response of these molecules to an applied electric field. Consequently, full geometry optimizations using density functional theory (DFT) methods were performed as a function of applied electric field (vide infra). As shown in FIG. 6A-B, the length of DT and MUDA are not predicted to substantially change, but helical $CA_6$ (Seq. Id. No.: 1) exhibits a large deformation along the molecular axis. Bond lengths do not distort appreciably, instead the applied field alters the pitch of the helix. The sharp length change of $CA_6$ (Seq. Id. No.: 1) predicted at ~1.1 V/nm involves a secondary structure transformation from an α-helix to a $3_{10}$-conformation. Such an abrupt conformational change would be expected because the applied field distorts the backbone dihedral angles. Using the linear response around zero field strength (±0.25 V/nm), the piezoelectric coefficient ($d_{33}$) of $CA_6$ (Seq. Id. No.: 1) is computed to be 14.7 pm/V, comparable to ZnO ($d_{33}$~9.9-27 pm/V) and PVDF ($d_{33}$-26 pm/V). Consistent with the large experimentally-observed difference in PFM amplitudes between CA$_6$ (Seq. Id. No.: 1), DT, and MUA (e.g. ~10 au for CA$_6$ (Seq. Id. No.: 1)/MUA in FIG. 2D), computed piezo coefficients for DT and MUA were small (0.54 pm/V and 1.55 pm/V for DT and MUA, respectively).

Figure 2D:
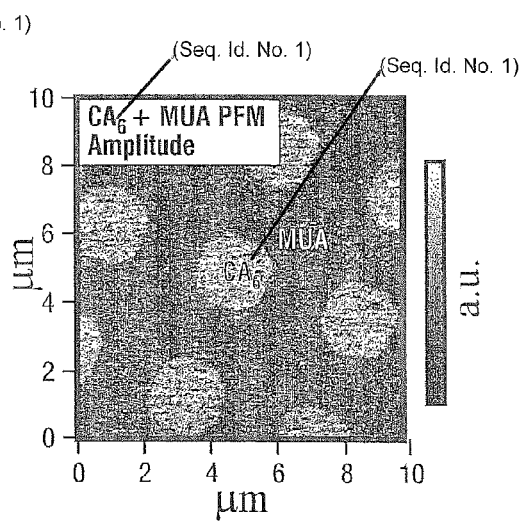

Fully extended, linear conformations of CA$_6$ (Seq. Id. No.: 1) are also predicted to exhibit small piezo coefficients (1.01 pm/V, FIG. 6C), similar in magnitude to MUA. Thus, these conformations would not be expected to show the clearly greater PFM response in the mixed CA$_6$ (Seq. Id. No.: 1)/MUA films (FIG. 2D). When random coil conformations, selected from the MD trajectories at low electric field strength, are optimized as a function of applied electric field, distortions of conformation do occur, but not as a smooth linear monotonic function of electric field strength (FIG. 6D). This confirms the MD results—namely that random or linear conformations of the CA$_6$ (Seq. Id. No.: 1) oligopeptide would not reliably, repeatedly deform with linear response to an applied electric field as observed experimentally.

The DFT-computed piezoresponse of helical CA$_6$ (Seq. Id. No.: 1) represents an ideal upper bounds of the experimentally observed deformation, since the calculation involves a field applied exactly parallel to the molecular axis to a peptide in vacuum, and assumes perfect electromechanical coupling. Qualitatively, both DFT-computed response and PFM characterization yield the same conclusion, namely that CA$_6$ (Seq. Id. No.: 1) exhibits substantial piezo deformation, and DT and MUA do not, because of their rigid molecular shape. The quantitative comparison of computed and PFM-measured d$_{33}$ piezo coefficients for CA$_6$ (Seq. Id. No.: 1) is good (14.7 pm/V for DFT and up to ~2 pm/V from PFM, based on line scans). The PFM technique is, at best, semi-quantitative, since the field from the conductive tip will be applied through an aqueous meniscus, and across a time-varying distance, due to the mechanical frequency of the tapping. Lower indentation on soft materials also provides an effective piezoelectric coefficient smaller than the actual value. Furthermore, based on the tip resolution, the PFM measurement will sample an ensemble of ~10$^4$ molecules which may not be responding coherently to the AC voltage. For example, recent studies have confirmed that self-assembled monolayers of helical molecules are disordered and exhibit varying tilt angles near the periphery.

Figure 4A:
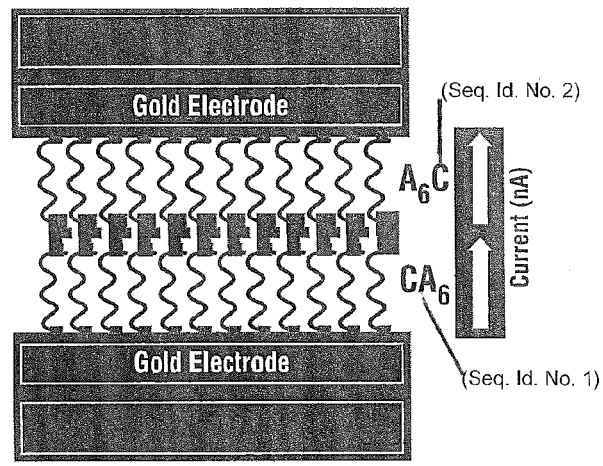
FIGS. 4A-4C show fabrication and characterization of a flexible molecular bilayer device.
Figure 4B:
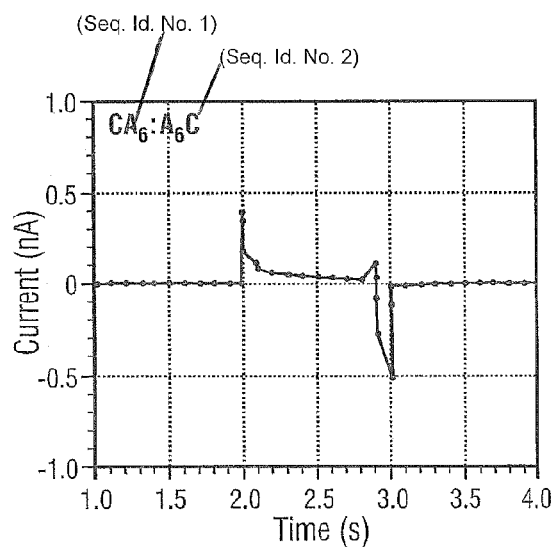
Figure 4C:
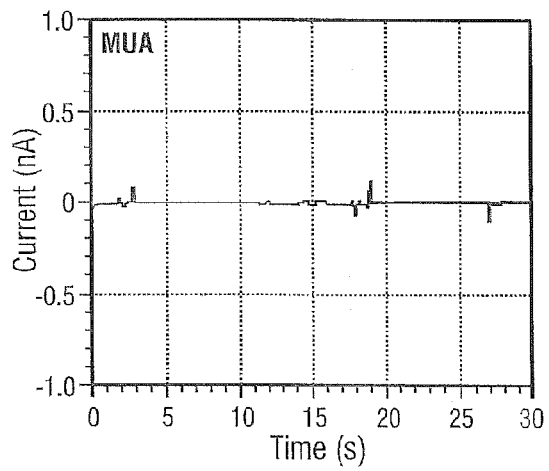

Another way to test the piezoresponse of the CA$_6$ (Seq. Id. No.: 1) molecules is by a bulk device. A test piezo generator was fabricated using a flexible PDMS substrate (FIG. 4A). Since making a top contact between a molecular monolayer and metal electrode is difficult, two monolayers: one with CA$_6$ (Seq. Id. No.: 1) self-assembled onto a ~40 nm-thick gold surface, and one with the opposite sequence A$_6$C (Seq. Id. No. 2) were prepared. When "sandwiched," the two monolayer films will inherently have aligned dipole moments, and thus the bilayer will be intrinsically polar. As a control, also prepared was a monolayer device of MUA (since a bilayer of MUA would have cancelling surface dipole moments), to ensure that any generated current is due to piezoelectric generation, and not changes in tunneling current or other effects. These films are qualitatively touch-sensitive (vida infra) with currents ~50 nA, but characterized their electromechanical properties using a 30 N load tester. As seen in FIG. 4B, both positive and negative generated current (~0.5 nA peak current) was produced from the CA$_6$ (Seq. Id. No.: 1):A$_6$C (Seq. Id. No. 2) bilayer devices, and the polarity of the current switches if the layering of the two monolayers (i.e., CA$_6$ (Seq. Id. No.: 1) on bottom, A$_6$C (Seq. Id. No. 2) on top, FIG. 4B, vs. A$_6$C (Seq. Id. No. 2) on bottom, CA$_6$ (Seq. Id. No.: 1) on top, FIG. 4C) is switched.

Similarly we see much less current (~0.1 nA) from devices formed from MUA (FIG. 4D). The measured current can be integrated to yield a piezoelectric coefficient of ~1 pC/N, in excellent agreement with the PFM results (1-2 pm/V).

Many previous studies have demonstrated the piezoactivity of biological materials. The presently measured piezoelectric response of monolayers of short peptides correspond well with such reports. While the applied bias voltages used in the PFM experiment appear large (e.g., 4V), the effective field across the monolayer is undoubtedly much smaller, judging by the computed piezoresponse using DFT. Therefore, it is speculated that many proteins may exhibit significant electromechanical response, since electrostatic fields due to molecular dipole moments, ions, etc. are ubiquitous on the nanoscale. The present results also suggest that the observed piezoactivity of skin, muscle and other biomaterials likely results from aligned helical domains.

There are several key implications of this result. First, it suggests that piezoelectric energy conversion can be used to self-power nanoscale organic electronics, such as flexible touch sensors. Since the piezoelectric effect also converts electric fields to motion, it also can be used to generate reliable nanoscale linear movement. Existing inorganic nanopiezotronics such as ZnO nanoribbons are also difficult to align and pattern, while the present disclosure demonstrates that simple self-assembly and solution patterning work with molecular piezoelectrics. Finally, one can imagine that the diversity of chemical synthetic techniques, combined with computational simulation and PFM characterization can be used to design highly piezo-responsive monolayers. If possible, this would enable a new class of piezomaterials, in which the deformation derives from intrinsic molecular conformational changes.

FIG. 7 shows atomic-force topography and piezo-force amplitude of patterned molecular monolayers: (A) AFM topography of oligopeptide CA$_6$ (Seq. Id. No.: 1), (B) AFM topography of dodecanethiol (DT), (C) DART-PFM amplitude of CA$_6$ (Seq. Id. No.: 1) with an applied bias of 3V, and (D) DART-PFM amplitude of DT with an applied bias of 3V.

Figure 8A:
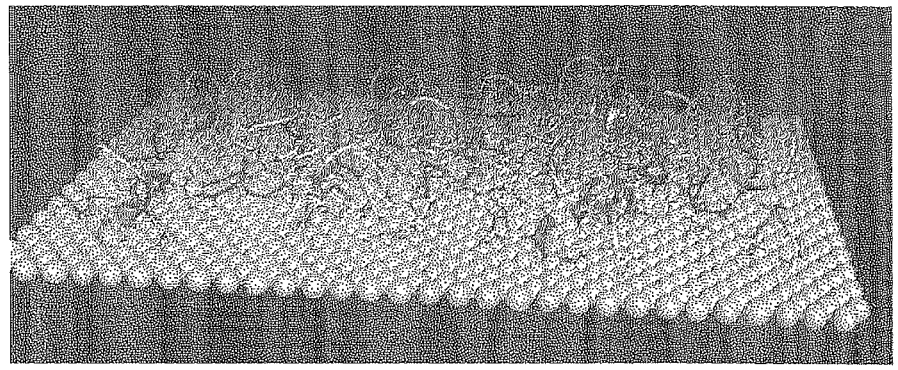
FIGS. 8A-8C show representative Molecular Dynamics Snapshots of $CA_6$ (Seq. Id. No.: 1) films wherein the gold layer is included for visualization purposes only and was not included in the MD.
Figure 8B:
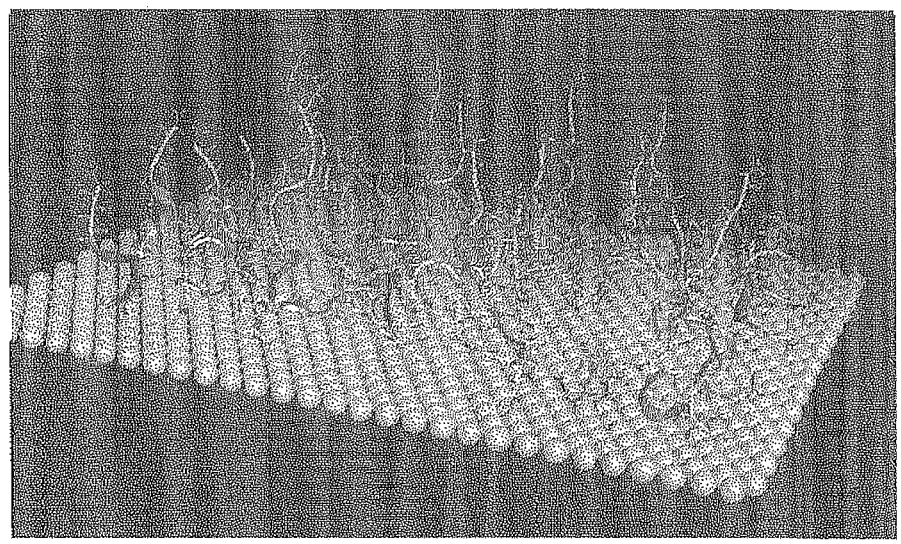
Figure 8C:
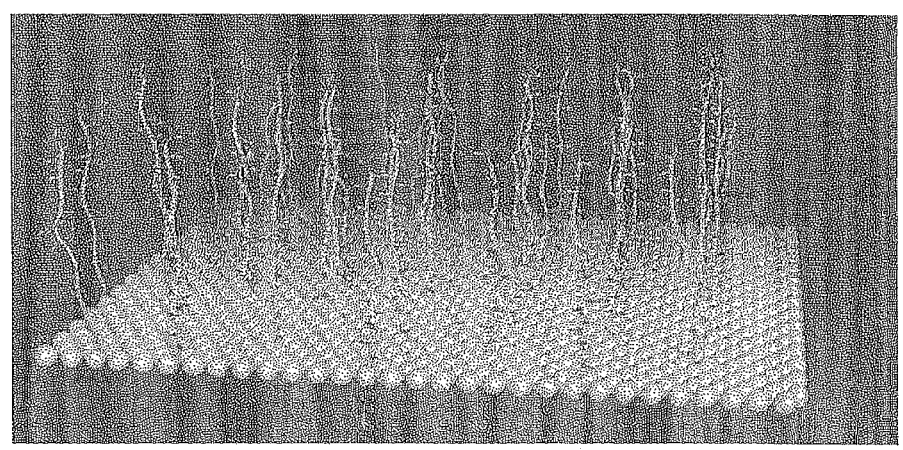
Figure 9A:
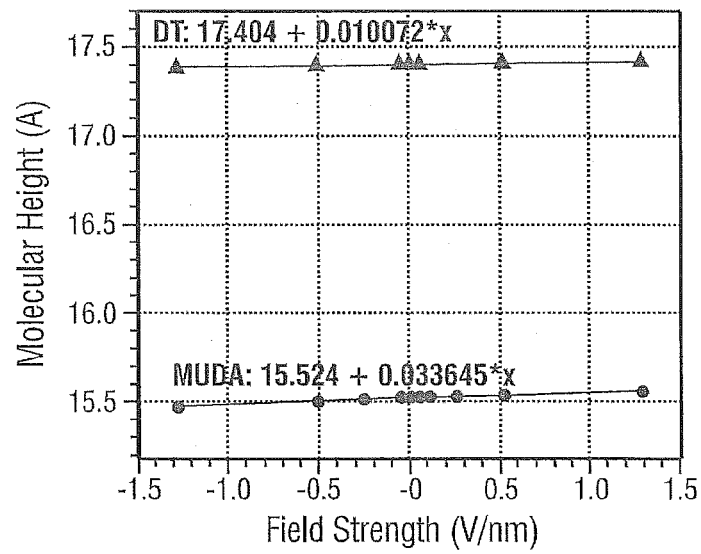
FIGS. 9A-9D show DFT geometry optimizations of molecules under study as a function of applied electric field.
Figure 9B:
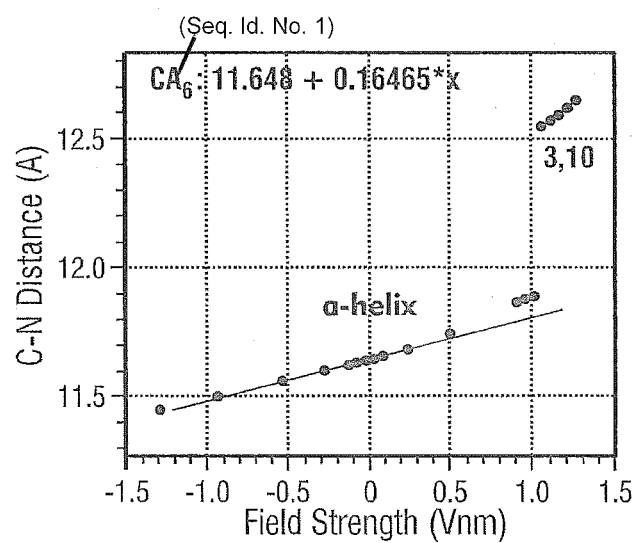
Figure 9C:
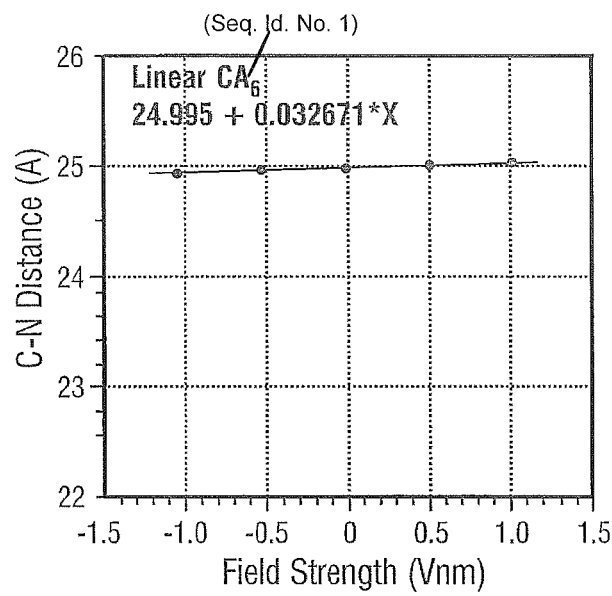
Figure 9D:
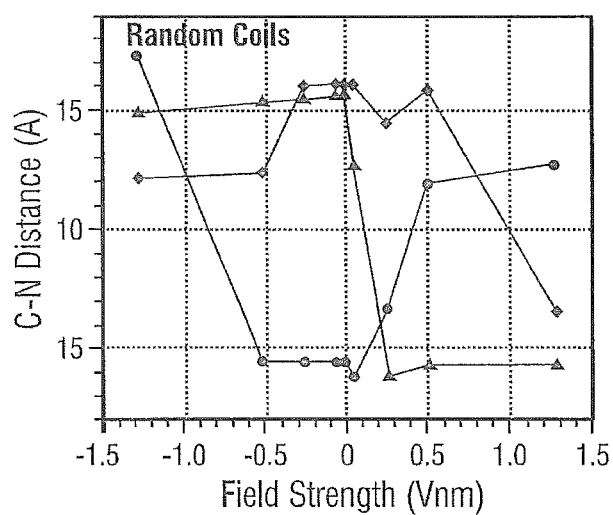

FIG. 8 shows representative Molecular Dynamics Snapshots of CA$_6$ (Seq. Id. No.: 1) films wherein the gold layer is included for visualization purposes only and was not included in the MD. The top snapshot, with no applied field, illustrates predominantly random coil conformations. The middle snapshot, with 1 V/nm applied field, illustrates the presence of helical domains and alignment with the z-axis of applied field. The bottom snapshot, with 4.3 V/nm applied field, highlights fully extended conformations.

FIG. 9 shows DFT geometry optimizations of molecules under study as a function of applied electric field: (a) dodecanethiol (DT) and 11-mercaptoundecanoic acid (MUA), using the molecular height along the z-axis, (b) α-helical CA$_6$ (Seq. Id. No.: 1) using the terminal C and N atoms, and showing linear response near zero field, and transition to a 3$_{10}$ helix at ~1.1 V/nm, (c) linear CA$_6$ (Seq. Id. No.: 1) using the terminal C and N atoms, showing little piezoresponse, and (d) three CA$_6$ (Seq. Id. No.: 1) random coil conformations from the MD trajectories, illustrating nonlinear response as the oligomer kinks and unkinks.

While oligopeptides can be directly purchased, they may not be the best possible piezoelectric molecules. Using DFT calculations, many polar molecules have been found according to the present disclosure that show large piezoresponse. For example, [6] helicenes are predicted to show much greater distortion than CA$_6$ (Seq. Id. No. 1) (~12% vs. 10.5%, respectively), corresponding to a piezo coefficient of ~48 pm/V. Several D key trends are: Peptides show strong nonlinear conformational changes; more rigid D-π-A molecules work well; regiochemistry shows the alignment of the dipole moment is critical; increased dipole moment from NO2/NH2; larger "clampenes" yield giant response—not just longer arms, but huge polarizability Induced Dipole. According to the present disclosure, inverse design and bounded genetic algorithm searches preferably may be used to find highly responsive molecules that are still synthetically accessible. Already found have been multiple small-molecule targets with piezoresponse predicted on-par with conventional ceramics (e.g., ZnO, BaTiO3). Hydrogen bonding is also intrinsically piezoelectric and may be capable of self-assembled multilayers. The Piezo Coefficient (pm/V) for the following materials are: PZT (Pb(Zr,Ti)O3)-250-500; BaTiO3-100-150; helicenes (computed)-40-150; ZnO-~20-25; PVDF (—CH2-CF2-)-~10-20; quartz-2.3; and biological materials-<1.0.

According to the present disclosure, novel "bottom-up" piezomaterials are possible with no poling (intrinsic response); having a monolayer with about $10^3$-$10^4$ molecules and ~2-3 nm thick, that is easy to pattern and align, and is intrinsically flexible. PFM gives an experimental screen that is semiquantitative, correlates with topology, and correlates with potential (SKPM). DFT gives a computational screen that is fast and easy, finds structure/property relationships, and provides a systematic, rational design.

Also, according to the present disclosure, second generation helicenes have been synthesized.

EXPERIMENTAL $CA_6$(Seq. Id. No.: 1), $A_6C$ (Seq. Id. No. 2), dodecanethiol, and 11-mercaptoundecanethiol (MUA) compounds were purchased from Sigma-Aldrich, Inc. without further purification. The epoxy resin (Epo-Tek 377) for making PDMS was obtained from Epoxy Technology. Silicone elastomer kit (Sylgard 184) was from Dow Corning Corp. High grade polydimethylsiloxane substrate for TS-gold was purchased from Ted Pella, Inc. Optical diffraction grating with 1 μm grooves was obtained from Rainbow Symphony, Inc. Metal deposition was performed using a Multi-source Electron Beam Evaporation System (Thermionics Laboratory VE180). Piezoresponse force microscopy (PFM) measurement was performed with a stock MFD-3D (Asylum Research) scanning probe microscopy (SPM) system, as described below.

Sample Preparation

Template-stripped (TS) gold (Hegner, M.; Wagner, P.; Semenza, G., *Surface Science*, 1993, 291, 39) was prepared by depositing 200 nm of gold onto a freshly-cleaved mica surface via E-beam evaporation with a base pressure of $2 \times 10^{-6}$ Torr. The first 50 nm thick layer was deposited at a rate of 0.1 Å/s, while the remaining 150 nm was deposited at 0.5 Å/s. The silicone elastomer starting materials were mixed according to the manufacturer's instruction. The gold side of the wafer was then glued to a glass slide with the silicone elastomer mixture and was put into oven at 150° C. for 1 hour for the elastomer to anneal. The mica-gold-silicone-glass sandwich was then immersed in tetrahydrofuran (THF) for several minutes to loosen the contact between mica and gold. The mica chips were then peeled off in THF using a pair of tweezers. The fresh gold surface was ready to use after drying with a stream of dry nitrogen.

Patterned Films

The two components of the epoxy adhesive were mixed and violently stirred for 10 minutes and then vacuumed for 30 minutes to drive the micro air bubbles away. When clear, the mixture was poured onto the diffraction grating and placed in oven at 60° C. for 1.5 hr. The cured polymer stamp was peeled off the grating and cut into pieces approximately 5 mm×10 mm. Before each stamping, the stamp was washed with acetone and isopropanol and dried with a gentle flow of nitrogen. A solution of 10 μM of dodecanethiol in ethanol, <1 mM of $CA_6$ (Seq. Id. No.: 1) and <1 mM of $A_6C$ (Seq. Id. No. 2) in 1:1 (v:v) water/acetonitrile were prepared as the "ink" source (due to the small amount of $CA_6$ (Seq. Id. No.: 1) and $A_6C$ (Seq. Id. No. 2) used, an accurate concentration of the oligoaminoacids was not determined). The stamp was dipped into 1 mL of the ink source for 5 minutes, dried in air and then stamped on the already prepared gold surface for 5 minutes before peeling off. Patterned DT, $CA_6$ (Seq. Id. No.: 1) and $A_6C$ (Seq. Id. No. 2) SAMs were made following the same procedure, respectively. A newly prepared stamp was used for each film.

Piezo-Force Microscopy (PFM)

PFM measurement was performed using an Asylum Research MFD-3D SPM with dual-AC resonance tracking (DART) PFM mode, unless otherwise specified in the text. Conducting probes with Ti/Pt coated on silicon tip (AC240TM, Asylum Research) with a first mode resonance frequency of 70 kHz and a normal stiffness of 2 N/m were used. The instrument set point was 0.1 V and PFM drive amplitude was set from 1-4 V. For each sample characterized with DART, the contact resonance was determined, usually around 280 kHz. Topography, amplitude, phase, as well as contact resonance images were all recorded. All reported amplitude images and values have been corrected for the sample resonance enhancement (i.e., q-corrected). Multiple samples were fabricated and measured for consistency.

Device Fabrication

A thin layer of PDMS was deposited onto a 5" silicon wafer prepared as above. A 5 nm layer of chromium was evaporated (via Thermionics Laboratory VE180, as above) onto the PDMS surface, followed by a 20 nm-thick gold layer. The as-fabricated metal-PDMS film was cut into 1 cm wide stripes. One stripe was immersed in $CA_6$ (Seq. Id. No.: 1) solution for 10 min and another stripe into $A_6C$ (Seq. Id. No. 2) solution for 10 min. The two surface-modified films were washed with acetone and water several times to remove additional molecules physisorbed onto the surface. The multi-layer film was then dried with a breeze of nitrogen. The two stripes were pressed against each other with the oligopeptide films touching. The overlap area varies from 1 $cm^2$ to 2 $cm^2$, depending on the size and geometry of the two metal-PDMS stripes. Both top and bottom stripes were connected to external electric wires via soldering iron. The as-made device is taped to a glass slide for electromechanical testing.

Device Electrochemical Testing

Electrical current was measured using a Keithley 2612 SourceMeter, and home-built custom software to track generated current with 50 ms resolution.

Computational Methods

Molecular Dynamics:

The molecular dynamics simulations consisted of a 7×7 array of 49 peptides, with sequences CAAAAAA ($CA_6$) (Seq. Id. No.: 1) or AAAAAAC ($A_6C$) (Seq. Id. No. 2), arranged on a plane that represented a hexagonal gold surface[svl] with Au . . . Au spacing of 2.88 Å. Each peptide started as ideal α-helix and the sulfur atom of each cysteine in the peptide was held fixed. The initial coordinates of the peptides is included in the supplementary material and were generated using MOE. For all MD runs, the Amber 99 force field parameters, as implemented in MOE, was used. See Cieplak, J., et al.; J. Comp. Chem. 22, 2001, 1048-1057.

Molecular Dynamics Protocols:

The molecular dynamics simulations were performed using NAMD 2.8. All simulations were done in vacuo using a 2 fs time step. Electrostatic and van der Waals interactions were switched off over that range of 2.5 Å starting at 10 Å. A pairlist for these interactions was calculated using a 13.5 Å distance. A temperature of 300 K was used in the simulations and was kept constant using a Langevin thermostat. The simulations were run for a total of 1 ns. For the non-zero field simulation, a 2.306 kcal/mol·Å·e (=1.0 V/nm) or 10.0 kcal/mol·Å·e (=4.35 V/nm) external electric field was applied in the +z direction, normal to the planar surface defined by the sulfur atoms of the peptides.

The trajectory file from each of the different simulations was analyzed using VMD. The first analysis was to calculate the average height each of the peptide was above the "gold" surface. The average height for each peptide was obtained by averaging the z coordinate for the terminal nitrogen atom of over frames 2500-4500 of a 5000 frame trajectory. The second analysis was to calculate the percent helix for each peptide over the same 2000 frames used to determine the average height above the surface. The helix content was determined using the sscalc routine in VMD. The output of the sscalc routine was used to determine the percent helix by adding the number of times a residue was determined to be an "h" (alpha-helix) or "g" (3-10 helix) and dividing that result by 7.

Density Functional Theory Geometry Optimizations:

A general computational analysis was done first for Cys-Ala$_6$ (CA$_6$) (Seq. Id. No.: 1), including optimization of molecule length, dipole moment and energy under different applied electric bias. To consider the conformational change in response to the electric field, the molecule was oriented to a specific frame of reference using Avogadro and the specific direction and magnitude of the field ±1.29 V/nm (±25×10$^{-4}$ a.u.) was added to the Gaussian input along the z-axis. Dodecanethiol and 11-mercaptoundecanoic acid were calculated and treated in the same way for direct comparison. The molecule height is defined as the distance between two atoms at the far ends of the helix. All calculations were performed with Gaussian 09 (Frisch, M. J.; Trucks, G. W.; Schlegel, H. B.; Scuseria, G. E.; Robb, M. A.; Cheeseman, J. R.; Scalmani, G.; Barone, V.; Mennucci, B.; Petersson, G. A. e. a. G., Revision A.02, Gaussian, Inc. Wallingford, Conn., USA, 2009) and density functional theory, with the B3LYP functional (Becke, A. D., *J. Chem. Phys.* 1993, 98, 5648; Lee, C.; Yang, W.; Parr, R. G., *Phys Rev B* 1988, 37, 785) and the 6-31G(d) basis set.

To compute the piezo coefficient ($d_{33}$), the following unit conversion was performed:

$$d_{33}(\text{pm/V}) = \frac{\Delta z(\text{Å})}{z(\text{Å}) F(\text{V/nm})} \times \frac{10^3 \text{pm}}{1 \text{ nm}}$$

where z is the height of the optimized geometry at zero electric field, $\Delta z$ is the difference in height between the optimized geometry at some field (e.g., 1.29 V/nm) and at zero field, and F is the field used.

It should be understood that while this invention has been described herein in terms of specific embodiments set forth in detail, such embodiments are presented by way of illustration of the general principles of the invention, and the invention is not necessarily limited thereto. Certain modifications and variations in any given material, process step or chemical formula will be readily apparent to those skilled in the art without departing from the true spirit and scope of the present invention, and all such modifications and variations should be considered within the scope of the claims that follow.

What is claimed is:

1. A piezoelectric material, comprising:
    a.) a piezoelectric self-assembling monolayer of oligopeptides, wherein each of the oligopeptides making up the self-assembling monolayer contains between two and twenty naturally occurring amino acids and wherein the amino acids are selected from the group consisting of: alanine, arginine, cysteine, glutamic acid, glutamine, isoleucine, leucine, lysine, methionine, serine and tryptophan;
b.) a conductive surface; and
c.) a substrate,
wherein the conductive surface is located between the piezoelectric self-assembling monolayer of oligopeptides and the substrate.

2. The piezoelectric material according to claim 1, wherein the piezoelectric self-assembling monolayer of oligopeptides is flexible.

3. The piezoelectric material according to claim 1, wherein the conductive surface is formed by vapor deposition of a conductive material onto the substrate.

4. The piezoelectric material according to claim 3, wherein the conductive material is a metal.

5. The piezoelectric material according to claim 4, wherein the metal is selected from the group consisting of: gold, silver, copper, aluminum, zinc and mercury.

6. The piezoelectric material according to claim 5, wherein the metal is gold.

7. The piezoelectric material according to claim 1, wherein the substrate is selected from the group consisting of: insulator and dielectric.

8. The piezoelectric material according to claim 7, wherein the substrate is a dielectric.

9. The piezoelectric material according to claim 1, wherein each of the oligopeptides making up the self-assembling monolayer has the amino acid sequence CAAAAAA (Seq. Id. No. 1).

10. The piezoelectric material according to claim 6, wherein the gold layer is between about 50 nm and about 400 nm thick.

11. The piezoelectric material according to claim 10, wherein the gold layer is about 200 nm thick.

12. The piezoelectric material according to claim 1, wherein the piezoelectric response as determined by piezo-force microscopy is between about 0.1 pm/V and about 2.0 pm/V.

13. The piezoelectric material according to claim 12, wherein the piezoelectric response is between about 0.3 pm/v and about 0.7 pm/V.

14. A touch sensitive device, comprising:
a.) a first piezoelectric material, comprising:
1.) a first piezoelectric self-assembling monolayer of oligopeptides having a first dipole moment;
2.) a conductive surface; and
3.) a substrate, and
b.) a second piezoelectric material, comprising:
1.) a second piezoelectric self-assembling monolayer of oligopeptides having a second dipole moment;
2.) a conductive surface; and
3.) a substrate,
wherein the oligopeptides making up the first and second piezoelectric self-assembling monolayers of the first and second piezoelectric materials, respectively, have reverse amino acid sequences and wherein the first dipole moment is equal and opposite the second dipole moment, and wherein each of the oligopeptides making up the first piezoelectric self-assembling monolayer has the amino acid sequence CAAAAAA (Seq. Id. No. 1) and each of the oligopeptides making up the second piezoelectric self-assembling monolayer has the amino acid sequence AAAAAAC (Seq. Id. No. 2).

15. The touch sensitive device according to claim 14, wherein the conductive surface is gold.

16. The touch sensitive device according to claim 15, wherein the substrate is polydimethylsiloxane.

* * * * *

SEQUENCE LISTING

```
<160> NUMBER OF SEQ ID NOS: 2

<210> SEQ ID NO 1
<211> LENGTH: 7
<212> TYPE: PRT
<213> ORGANISM: Artificial Sequence
<220> FEATURE:
<223> OTHER INFORMATION: Synthetic

<400> SEQUENCE: 1

Cys Ala Ala Ala Ala Ala Ala
1               5

<210> SEQ ID NO 2
<211> LENGTH: 7
<212> TYPE: PRT
<213> ORGANISM: Artificial Sequence
<220> FEATURE:
<223> OTHER INFORMATION: Synthetic

<400> SEQUENCE: 2

Ala Ala Ala Ala Ala Ala Cys
1               5
```